(12) United States Patent
Singh et al.

(10) Patent No.: US 8,946,039 B2
(45) Date of Patent: Feb. 3, 2015

(54) POLYSILICON RESISTOR FORMATION

(71) Applicant: GLOBALFOUNDRIES Inc., Grand Cayman (KY)

(72) Inventors: Jagar Singh, Clifton Park, NY (US); Shesh Mani Pandey, Clifton Park, NY (US); Roderick Miller, Mechanicville, NY (US); Nam Sung Kim, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/767,930

(22) Filed: Feb. 15, 2013

(65) Prior Publication Data
US 2014/0231960 A1    Aug. 21, 2014

(51) Int. Cl.
*H01L 21/8222* (2006.01)
*H01L 49/02* (2006.01)

(52) U.S. Cl.
CPC .................................... *H01L 28/20* (2013.01)
USPC ........... 438/331; 438/332; 438/356; 438/383; 438/385

(58) Field of Classification Search
None
See application file for complete search history.

(56) References Cited

U.S. PATENT DOCUMENTS 4,212,684 A * 7/1980 Brower .......................... 438/238

* cited by examiner

*Primary Examiner* — Kyoung Lee
(74) *Attorney, Agent, or Firm* — Williams Morgan, P.C.

(57) ABSTRACT

Aspects of the present invention relate to an approach for implanting and forming a polysilicon resistor with a single implant dose. Specifically, a mask having a set of openings is formed over a resistor surface. The set of openings are typically formed in a column-row arrangement according to a predetermined pattern. Forming the mask in this manner allows the resistor surface to have multiple regions/zones. A first region is defined by the set of openings in the mask, and a second region is defined by the remaining portions of the mask. The resistor is then subjected to a single implant dose via the openings. Implanting the resistor in this manner allows the resistor to have multiple resistance values (i.e., a first resistance value in the first region, and a second resistance value in the second region).

20 Claims, 5 Drawing Sheets

POLYSILICON RESISTOR FORMATION

BACKGROUND

1. Technical Field

In general, aspects of the present invention relate to polysilicon resistor formation. Specifically, aspects of the present invention relate to an implantation approach that, among other things, reduces mask numbers and improves resistor mismatch.

2. Related Art

Polysilicon resistors are commonly utilized in devices such as semiconductor passive devices in various semiconductor applications such as analog-to-digital (ADC) converters, digital-to-analog (DAC) converters, matched resistors, static random access memory (SRAM) device pairings, complimentary metal-oxide semiconductor devices, digital and analog circuits, etc. Among other things, polysilicon resistors are known for their superior linearity. In general, polysilicon resistors can be fabricated on a polysilicon gate material, or by a separate polysilicon deposition process on dielectric oxide or isolation layers. In a typical implementation, the polysilicon resistor is implanted with a dopant over an entire length/width of the resistor surface. Thus, to have multiple resistance values, multiple mask and implant steps are required. Such an approach may lead to reduced performance and manufacturing inefficiencies.

SUMMARY OF THE INVENTION

In general, aspects of the present invention relate to an approach for implanting and forming a polysilicon resistor with a single implant dose. Specifically, a mask having a set of openings is formed over a resistor surface. The set of openings are typically formed in a column-row arrangement according to a predetermined pattern. Forming the mask in this manner allows the resistor surface to have multiple regions/zones. A first region is defined by the set of openings in the mask, and a second region is defined by the remaining portions of the mask. The resistor is then subjected to a single implant dose via the openings. Implanting the resistor in this manner allows the resistor to have multiple resistance values (i.e., a first resistance value in the first region, and a second resistance value in the second region).

A first aspect of the present invention provides a method for forming a resistor, comprising: forming a set of openings in a mask over a resistor surface, the set of openings being formed according to a predetermined pattern; and implanting the set of openings with a single implant dose to yield a resistor having multiple resistance values.

A second aspect of the present invention provides a method for forming a resistor, comprising: forming a set of openings in a mask over a resistor surface, the set of openings being formed according to a predetermined pattern, and the set of openings resulting in the resistor having a first region defined by the set of openings and a second region defined by the remaining portions of the mask; and implanting the set of openings with a single implant dose, the implanting resulting in different resistance values between the first region and the second region.

A third aspect of the present invention provides a resistor, comprising: a resistor surface; and an implant region over the resistor surface, the implant region being defined by a set of openings formed in a mask over the resistor surface, the set of openings being formed according to a predetermined pattern, and the set of openings resulting in the resistor surface having a first region defined by the set of openings and a second region defined by the remaining portions of the mask.

BRIEF DESCRIPTION OF THE DRAWINGS

These and other features of this invention will be more readily understood from the following detailed description of the various aspects of the invention taken in conjunction with the accompanying drawings in which.

Figure 1:
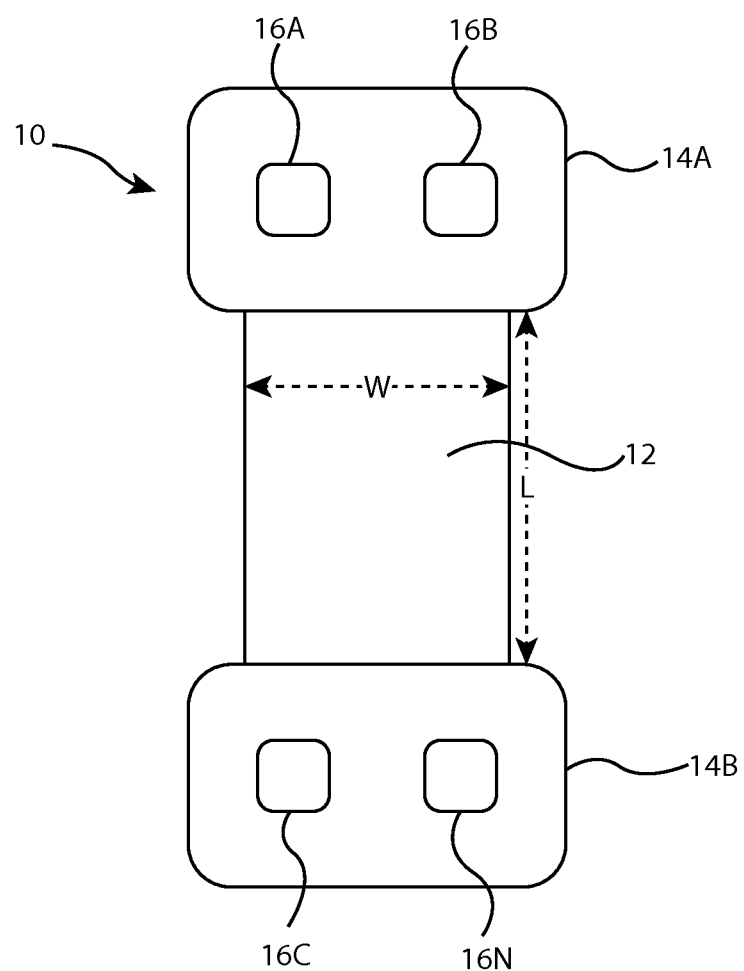
FIG. 1 shows a poly-resistor.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g.

a second layer) wherein intervening elements, such as an interface structure (e.g. interface layer) may be present between the first element and the second element.

As indicated above, aspects of the present invention relate to an approach for implanting and forming a polysilicon resistor with a single implant dose. Specifically, a mask having a set of openings is formed over a resistor surface. The set of openings are typically formed in a column-row arrangement according to a predetermined pattern. Forming the mask in this manner allows the resistor surface to have multiple regions/zones. A first region is defined by the set of openings in the mask, and a second region is defined by the remaining portions of the mask. The resistor is then subjected to a single implant dose via the openings. Implanting the resistor in this manner allows the resistor to have multiple resistance values (i.e., a first resistance value in the first region, and a second resistance value in the second region).

In traditional approaches, fabrication of poly-resistors required two different implantations. For example, in the case of a 28LPH device, there are two poly-resistors that require two distinct values and two masking steps.

A typical layout of a poly-resistor 10 is shown FIG. 1. As depicted, resistor 10 includes a resistor surface 12 and RENDs 14A-B with contact openings 16A-N. In previous approaches, the implant region for resistor 10 is opened over the full resistor width (W), and/or length (L). This caused resistor surface 12 to be commonly doped and have a common resistance. If multiple resistance values were desired, an additional masking step and doping step had to be performed.

Figure 2:
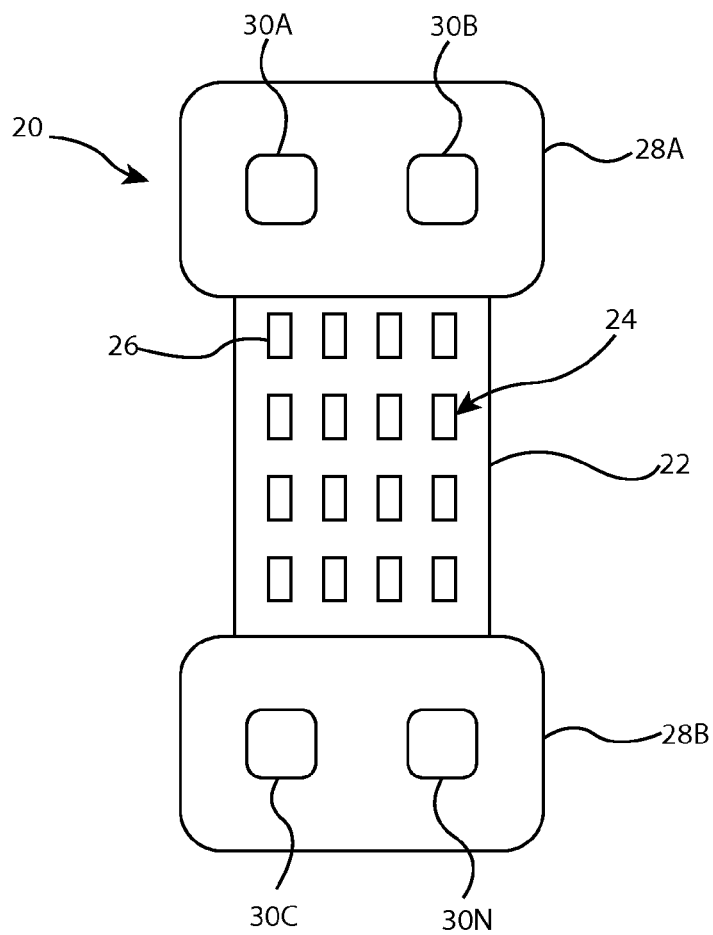
FIG. 2 depicts a poly-resistor according to an embodiment of the present invention.

Referring to FIG. 2, a poly-resistor (e.g., polysilicon) 20 according to the present invention is shown. As depicted, resistor 20 includes a resistor surface 22, RENDs 28A-B, and contact openings 30A-N. In contrast to resistor 10 of FIG. 1, the entire area (e.g., width) of resistor surface 22 is not implanted (e.g., comprises the "implant region"). Rather, a mask 24 is utilized having a set of openings/boxes 26 formed according to a predetermined pattern. As depicted, openings 26 may be a set of rectangles arranged in a column-row manner. Set of openings 26 may be aligned in a way to achieve improved device performance. Regardless, set of openings 26 allows surface 22 to have multiple distinct regions: (1) a first region defined by set of spaces 26 in mask 24, and (2) a second region defined by the other portions of mask 24. During the subsequent implant operation (e.g., using a dopant ion such as boron, phosphorus, antimony arsenic, etc.) the regions inside/under set of spaces 26 in mask 24 receive the implant, while the region outside/around each opening 26 is blocked for implant. Thus, the first region may have one resistance value, while the second region may have a different resistance value. That is, with a single implant dose, two or more resistance values can be achieved by providing openings 26 over the poly-resistor surface 22.

In general, the minimum implant opening area such as that shown in FIG. 2 depends upon the minimum implant mask feature size. Polysilicon resistor widths are typically wider than the implant regions' sizes (e.g., especially the source and drain implant mask sizes). The width and length of the implant boxes and the number of rows of openings placed within the width of resistor 20 may depend upon the width of the polysilicon resistor and the implanted mask minimum feature size. The number of boxes/spaces and lines may also help to determine the resistor 20's performance and device-to-device matching.

Figure 3:
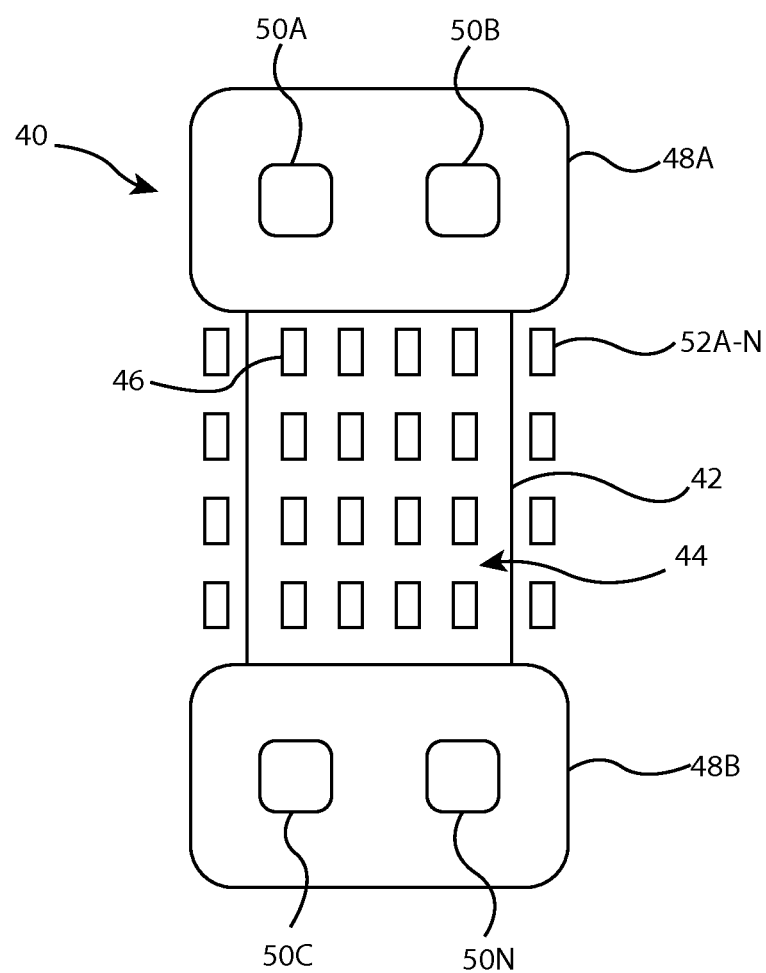
FIG. 3 depicts a poly-resistor according to an embodiment of the present invention.
Figure 4:
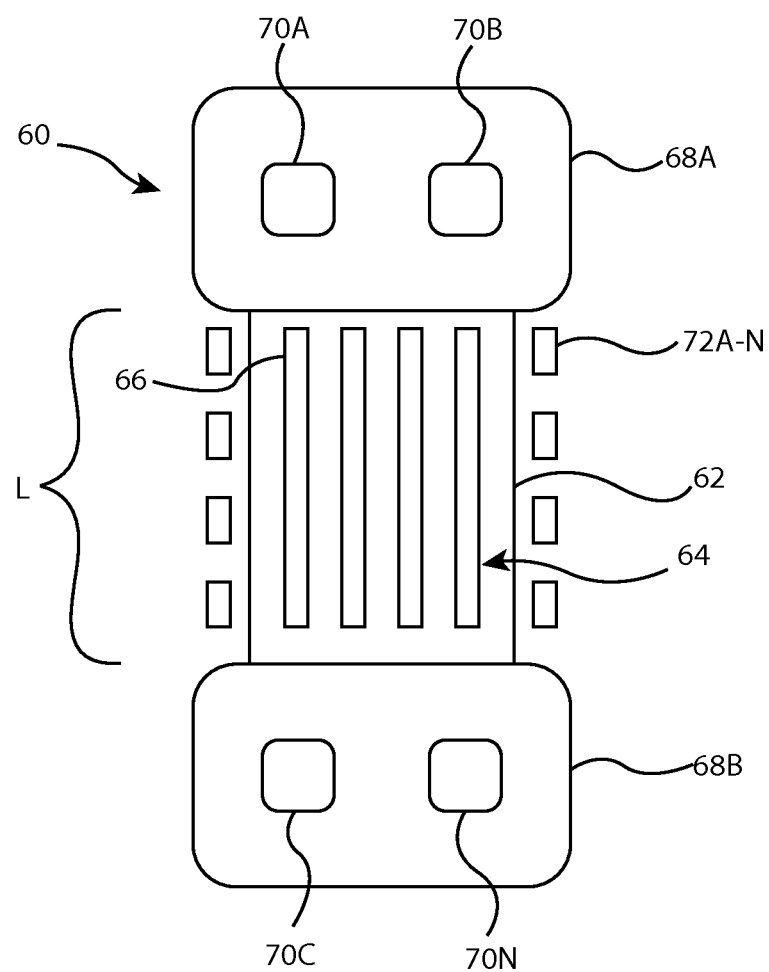
FIG. 4 depicts a poly-resistor according to an embodiment of the present invention.
Figure 5:
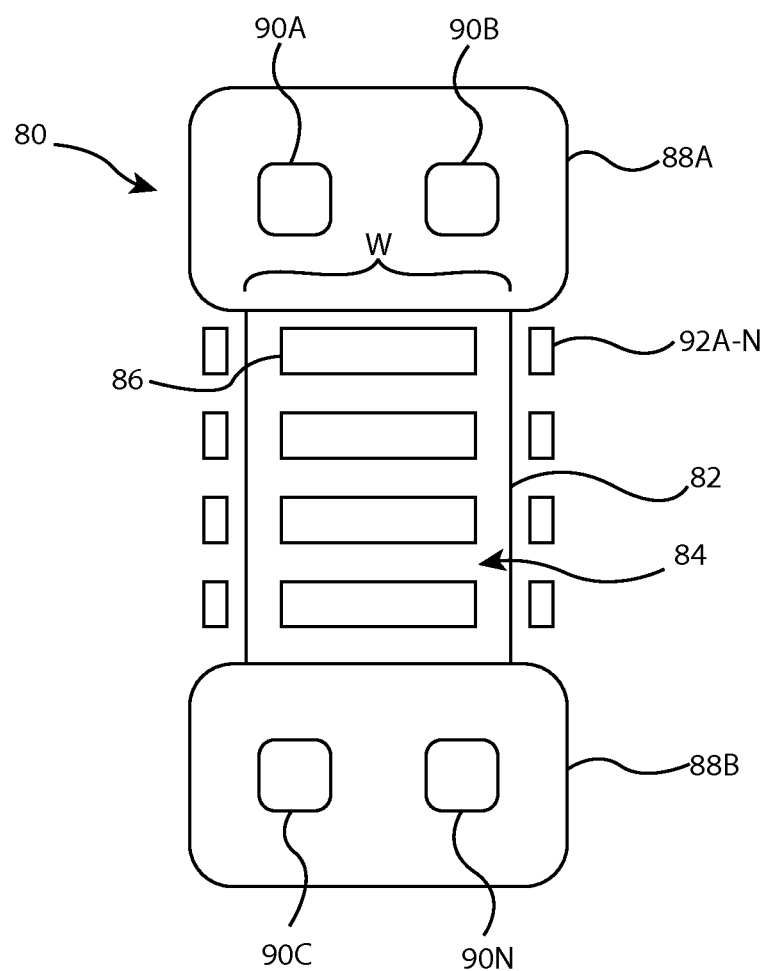
FIG. 5 depicts a poly-resistor according to an embodiment of the present invention.

Other variations of this approach are shown in FIGS. 3-5. As shown first in FIG. 3, a poly-resistor (e.g., polysilicon) 40 is shown. As depicted, resistor 40 includes a resistor surface 42, RENDs 48A-B, and contact openings 50A-N. Similar to resistor 20 of FIG. 2, the entire area (e.g., width) of resistor surface 42 is not implanted in the implant region. Rather, a mask 44 is utilized having a set of openings 46 formed according to a predetermined pattern. However, resistor 40 of FIG. 3 further comprises a set of dummy boxes/objects 52A-N to minimize a boundary effect of resistor 40.

FIG. 4 shows a poly-resistor (e.g., polysilicon) 60. As depicted, resistor 60 includes a resistor surface 62, RENDs 68A-B, and contact openings 70A-N. Similar to resistors 20 and 40 of FIGS. 2 and 3, the entire area (e.g., width) of resistor surface 62 is not implanted in the implant region. Rather, a mask 64 is utilized having a set of openings 66 formed according to a predetermined pattern. Similar to resistor 40 of FIG. 3, resistor 60 comprises a set of dummy boxes/objects 72A-N to minimize an effect of a boundary effect of resistor 60. However, as shown, the pattern of openings 66 in mask 64 is distinct. That is, a series of columns of bar-like spaces 66 have been provided along the length (L) of resistor surface 62.

FIG. 5 shows a poly-resistor (e.g., polysilicon) 80. As depicted, resistor 80 includes a resistor surface 82, RENDs 88A-B, and contact openings 90A-N. Similar to resistors 20, 40, and 60 of FIGS. 2, 3, and 4, the entire area (e.g., width) of resistor surface 82 is not implanted in the implant region. Rather, a mask 84 is utilized having a set of openings 86 formed according to a predetermined pattern. Similar to resistors 40 and 50 of FIGS. 3 and 4, resistor 80 comprises a set of dummy boxes/objects 92A-N to minimize an effect of a boundary effect of resistor 80. However, as shown, the pattern of openings 86 in mask 84 is distinct. That is, a series of rows of bar-like spaces 86 have been provided along the width (W) of resistor surface 82.

FIGS. 2-5 are intended to demonstrate that various alterations on the teachings recited herein may be implemented within the scope of the present invention. By aligning the patterns shown in FIGS. 2-5 in various orientations, features such as edge roughness, implant side diffusion, and current crowding can be minimized, hence improving overall resistor matching. Along these lines, resistor matching may be achieved by limiting current flow in the high variable region. Various pattern filling techniques are outlined to achieve better matching among the resistors. In one technique, implantation over the edge roughness area may be omitted. Also, diffusion from a side implant may be minimized to reduce the polysilicon resistor mismatch.

Further, various box/opening implantation patterns may be designed to improve the resistor matching as shown in FIGS. 4-5. In these patterns, the orientation of the implant opening is selected in such a way to minimize the device-to-device matching variation. With these implant opening alignments, an effect of edge side roughness, implant side diffusion, etch loading and variation, which are major sources of variation, can be minimized. Moreover, these alignments may significantly minimize the influences of parasitic resistance and capacitance, thus improving the overall device and circuit performance. It is understood that although the drawings discussed herein depict rectangular openings, this need not be the case. Rather any shape of openings could be implemented. Moreover, these teachings could be applied to any type of implant resistor (e.g., n-well, p-well, etc.), not just polysilicon resistors.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a resistor, comprising:
    forming a set of openings in a mask over a resistor surface portion of the resistor, the resister including the resistor surface and a set of RENDs having contact openings and being located on an end portion of the resistor, the set of openings being formed according to a predetermined pattern; and
    implanting the set of openings with a single implant dose to yield a resistor having multiple resistance values.

2. The method of claim 1, further comprising providing a set of dummy areas adjacent the resistor surface to minimize a boundary effect of the forming.

3. The method of claim 1, the single implant dose comprising boron.

4. The method of claim 1, the predetermined pattern comprising a set of columns and rows of openings in the resistor surface.

5. The method of claim 1, the predetermined pattern being aligned in a pre-determined direction on the resistor surface to improve at least one of the following: an effect of edge side roughness, implant side diffusion, or etch loading and variation.

6. The method of claim 1, the resistor comprising a polysilicon resistor.

7. The method of claim 1, the set of openings comprising a plurality of rectangular-shaped openings.

8. A method for forming a resistor, comprising:
    forming a set of openings in a mask over a resistor surface portion of the resistor, the resister including the resistor surface and a set of RENDs having contact openings and being located on an end portion of the resistor, the set of openings being formed according to a predetermined pattern, and the set of openings resulting in the resistor having a first region defined by the set of openings and a second region defined by the remaining portions of the mask; and
    implanting the set of openings with a single implant dose, the implanting resulting in different resistance values between the first region and the second region.

9. The method of claim 8, further comprising providing a set of dummy areas adjacent the resistor surface to minimize a boundary effect of the forming.

10. The method of claim 8, the single implant dose comprising boron.

11. The method of claim 8, the predetermined pattern comprising a set of columns and rows of openings in the resistor surface.

12. The method of claim 8, the predetermined pattern being aligned in a pre-determined direction on the resistor surface to improve at least one of the following: an effect of edge side roughness, implant side diffusion, or etch loading and variation.

13. The method of claim 8, the resistor comprising a polysilicon resistor.

14. The method of claim 8, the set of openings comprising a plurality of rectangular-shaped openings.

15. A resistor, comprising:
    a set of RENDs having contact openings and being located on an end portion of the resistor;
    a resistor surface; and
    an implant region over the resistor surface, the implant region being defined by a set of openings formed in a mask over the resistor surface, the set of openings being formed according to a predetermined pattern, and the set of openings resulting in the resistor surface having a first region defined by the set of openings and a second region defined by the remaining portions of the mask.

16. The resistor of claim 15, further comprising a set of dummy areas positioned adjacent the resistor surface to minimize a boundary effect of the forming.

17. The resistor of claim 15, the resistor being implanted via a single implant dose, the single implant dose resulting in the first region having a first resistance and the second region having a second resistance.

18. The resistor of claim 15, the predetermined pattern comprising a set of columns and rows of openings in the resistor surface.

19. The resistor of claim 15, the predetermined pattern being aligned in a pre-determined direction on the resistor surface to improve at least one of the following: an effect of edge side roughness, implant side diffusion, or etch loading and variation.

20. The resistor of claim 15, the set of openings improve a mismatch of the resistor.

* * * * *